United States Patent
Perumana et al.

(10) Patent No.: US 10,256,865 B2
(45) Date of Patent: Apr. 9, 2019

(54) BIDIRECTIONAL TRANSCEIVER CIRCUITS

(71) Applicant: Broadcom Corporation, Irvine, CA (US)

(72) Inventors: Bevin George Perumana, Anaheim, CA (US); Tirdad Sowlati, Irvine, CA (US); Saikat Sarkar, Irvine, CA (US); Seunghwan Yoon, Irvine, CA (US)

(73) Assignee: Avago Technologies International Sales PTE. Limited, Singapore (SG)

( * ) Notice: Subject to any disclaimer, the term of this patent is extended or adjusted under 35 U.S.C. 154(b) by 126 days.

(21) Appl. No.: 15/338,231

(22) Filed: Oct. 28, 2016

(65) Prior Publication Data

US 2017/0338854 A1    Nov. 23, 2017

Related U.S. Application Data

(60) Provisional application No. 62/337,834, filed on May 17, 2016.

(51) Int. Cl.
| | |
|---|---|
| *H04J 3/00* | (2006.01) |
| *H04B 1/56* | (2006.01) |
| *H04L 5/14* | (2006.01) |

(52) U.S. Cl.
CPC .............. *H04B 1/56* (2013.01); *H04L 5/1469* (2013.01)

(58) Field of Classification Search
CPC .. H04B 1/56; H04B 1/403; H04L 5/14; H04L 5/1469

USPC .......................................................... 370/280
See application file for complete search history.

(56) References Cited

U.S. PATENT DOCUMENTS

| 5,027,125 A * | 6/1991 | Tang ...................... H01Q 3/24 342/368 |
|---|---|---|
| 2005/0146463 A1* | 7/2005 | Moldoveanu .......... H01Q 1/246 342/368 |
| 2009/0290034 A1* | 11/2009 | Ludwig ................... H04N 5/225 348/218.1 |
| 2010/0066631 A1* | 3/2010 | Puzella ..................... H01Q 1/02 343/853 |
| 2010/0233987 A1* | 9/2010 | Rafi ........................ H03D 7/00 455/323 |
| 2014/0169510 A1* | 6/2014 | Mikhemar ............... H04B 1/00 375/345 |
| 2016/0285500 A1* | 9/2016 | Tsai ..................... H04B 1/0064 |

* cited by examiner

*Primary Examiner* — Sai Ming Chan
(74) *Attorney, Agent, or Firm* — Morgan, Lewis & Bockius LLP

(57) ABSTRACT

A bidirectional time-division duplexing transceiver circuit includes a first and a second bidirectional phase-shift circuit, and a bidirectional amplifier circuit including a first amplifier circuit and a second amplifier circuit. The first amplifier circuit and the second amplifier circuit are coupled via double-pole-double-throw (DPDT) switches to radio-frequency (RF) antennas and the first and the second bidirectional phase-shift circuits. The (DPDT) switches enable the first amplifier circuit and the second amplifier circuit to be operable simultaneously as transmit (TX) path amplifiers in a first time slot and as a receive (RX) path amplifiers in a second time slot.

20 Claims, 9 Drawing Sheets

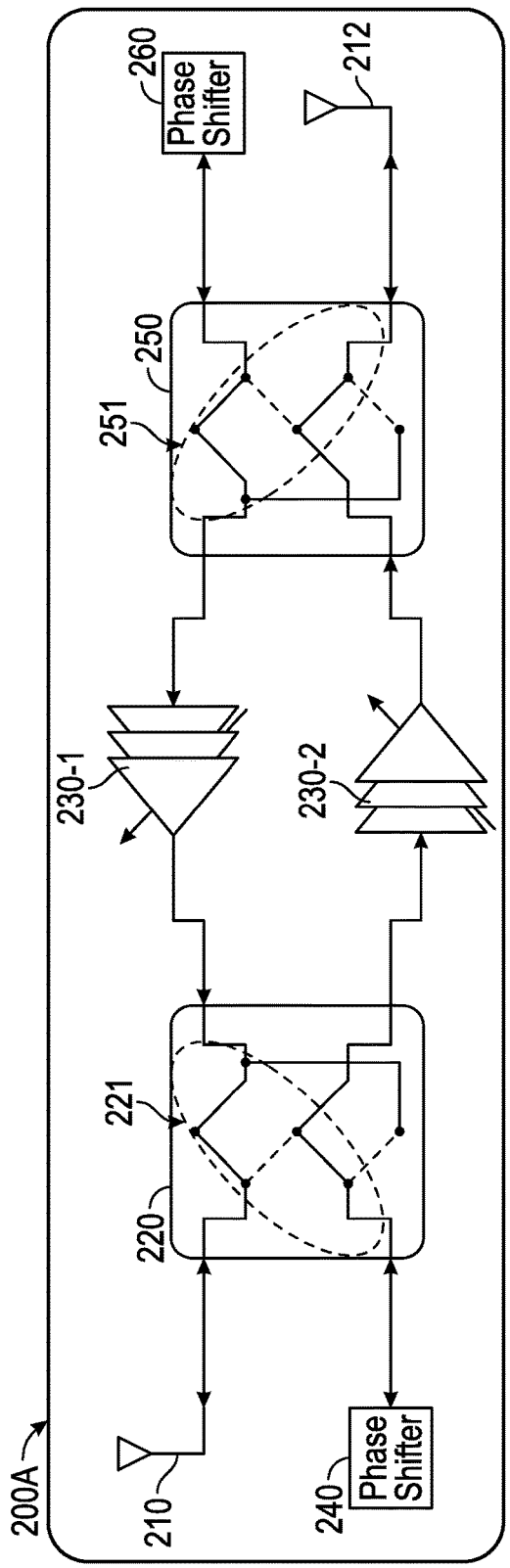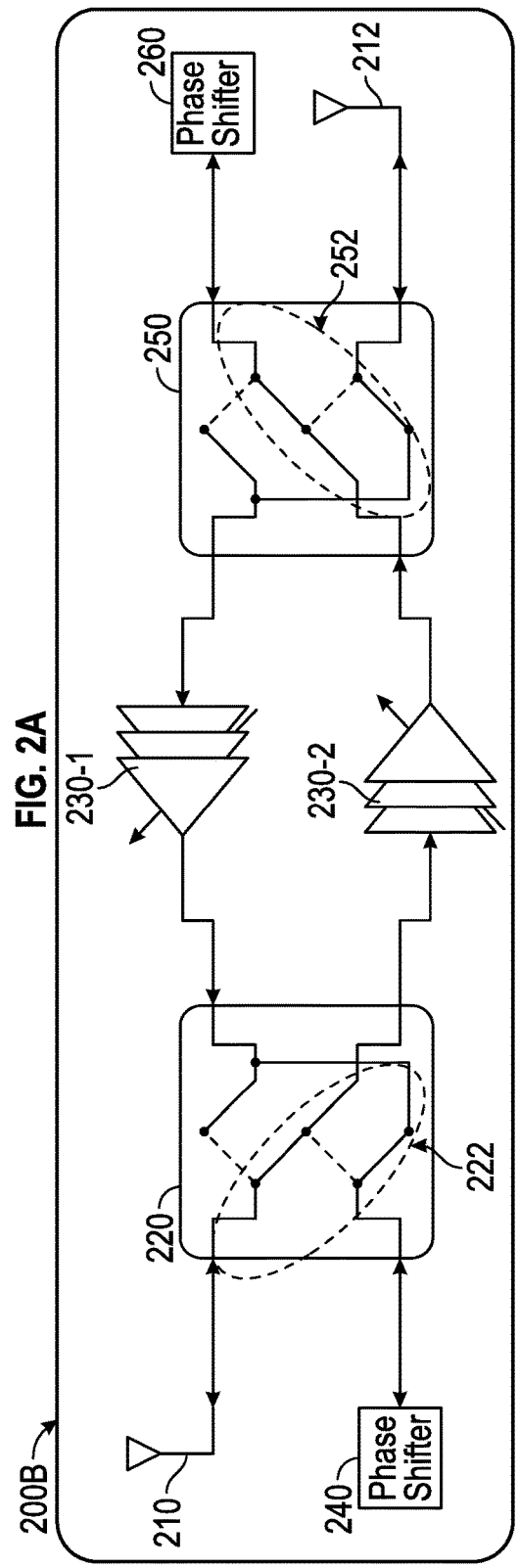

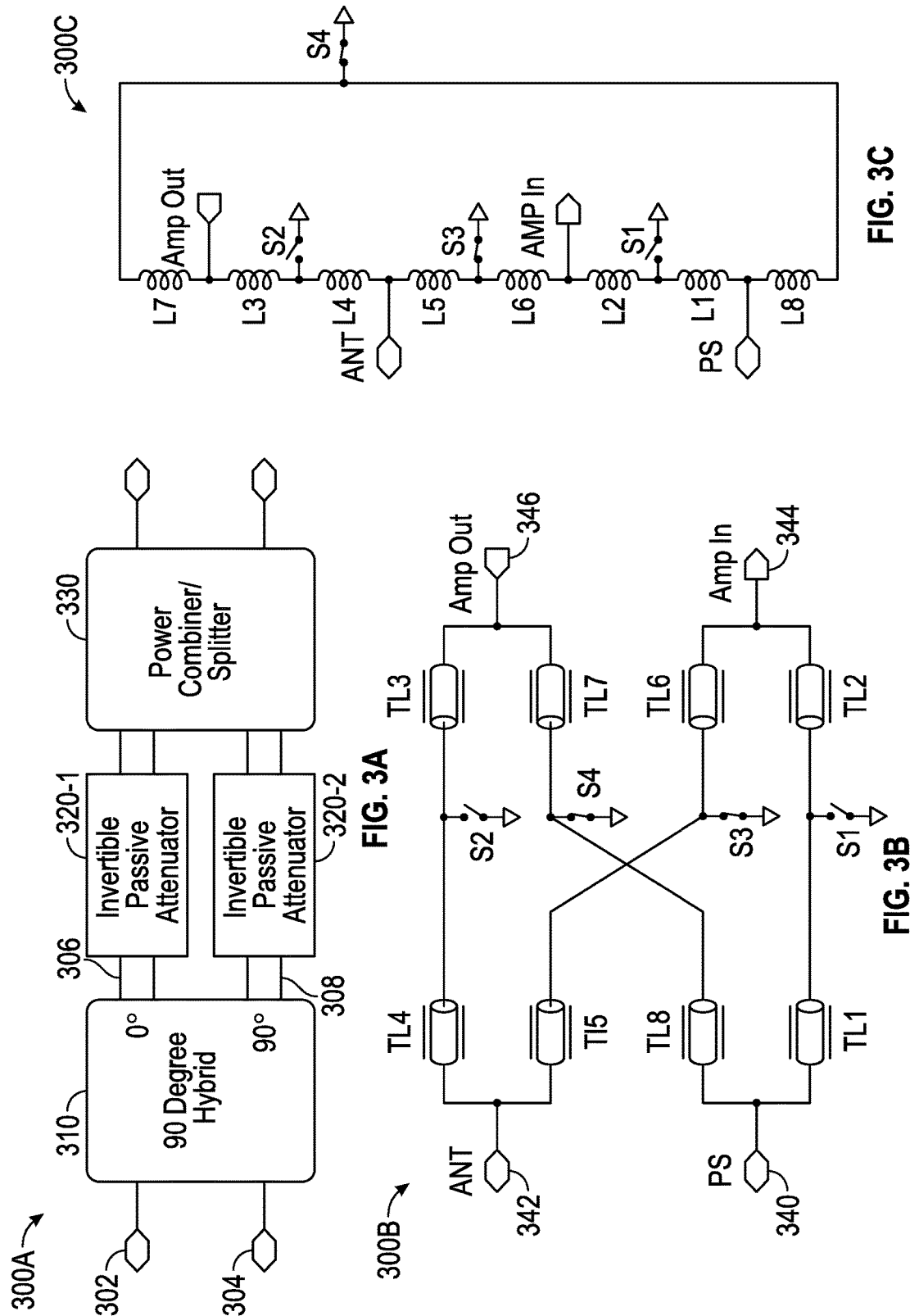

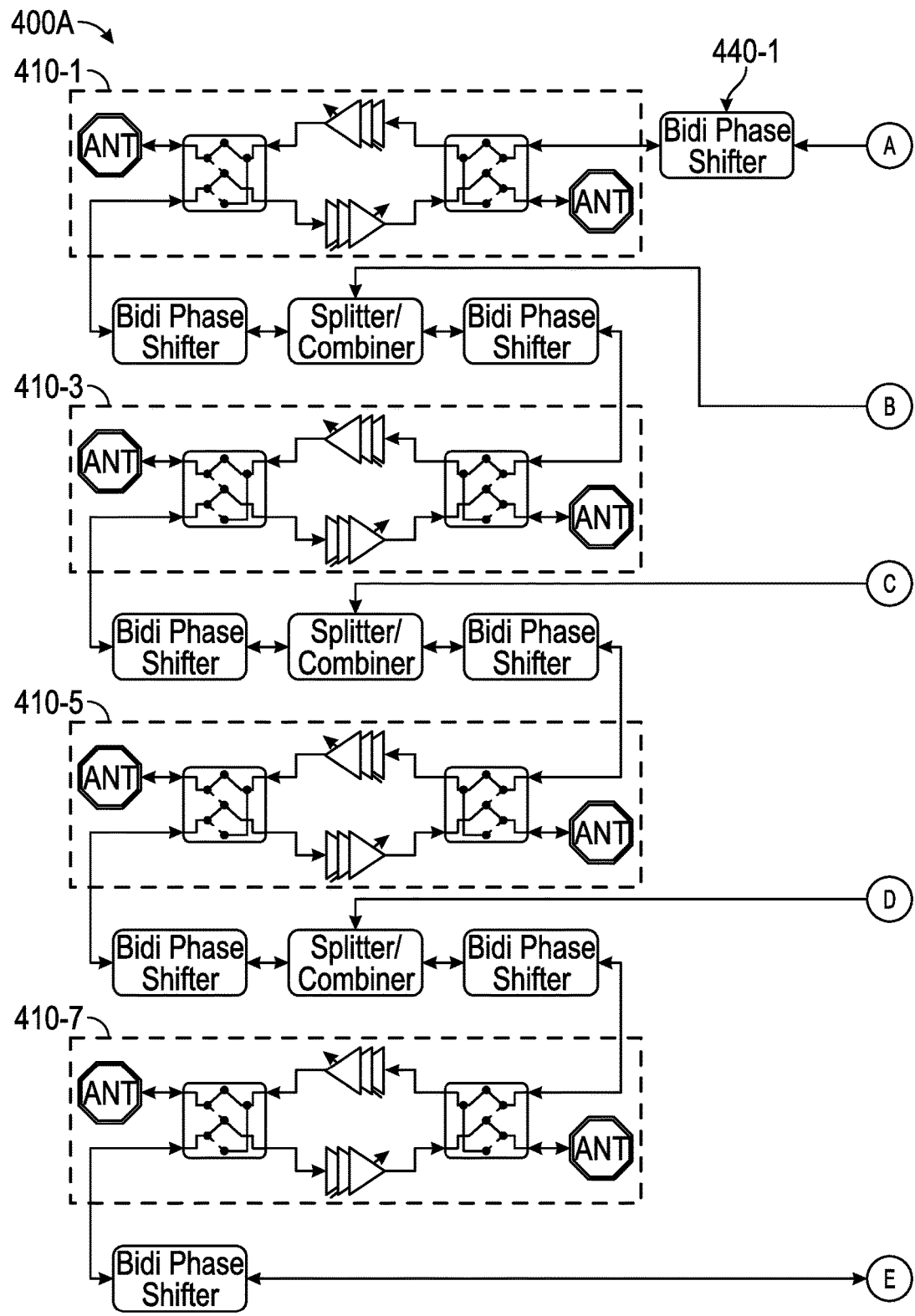
FIG. 4A1

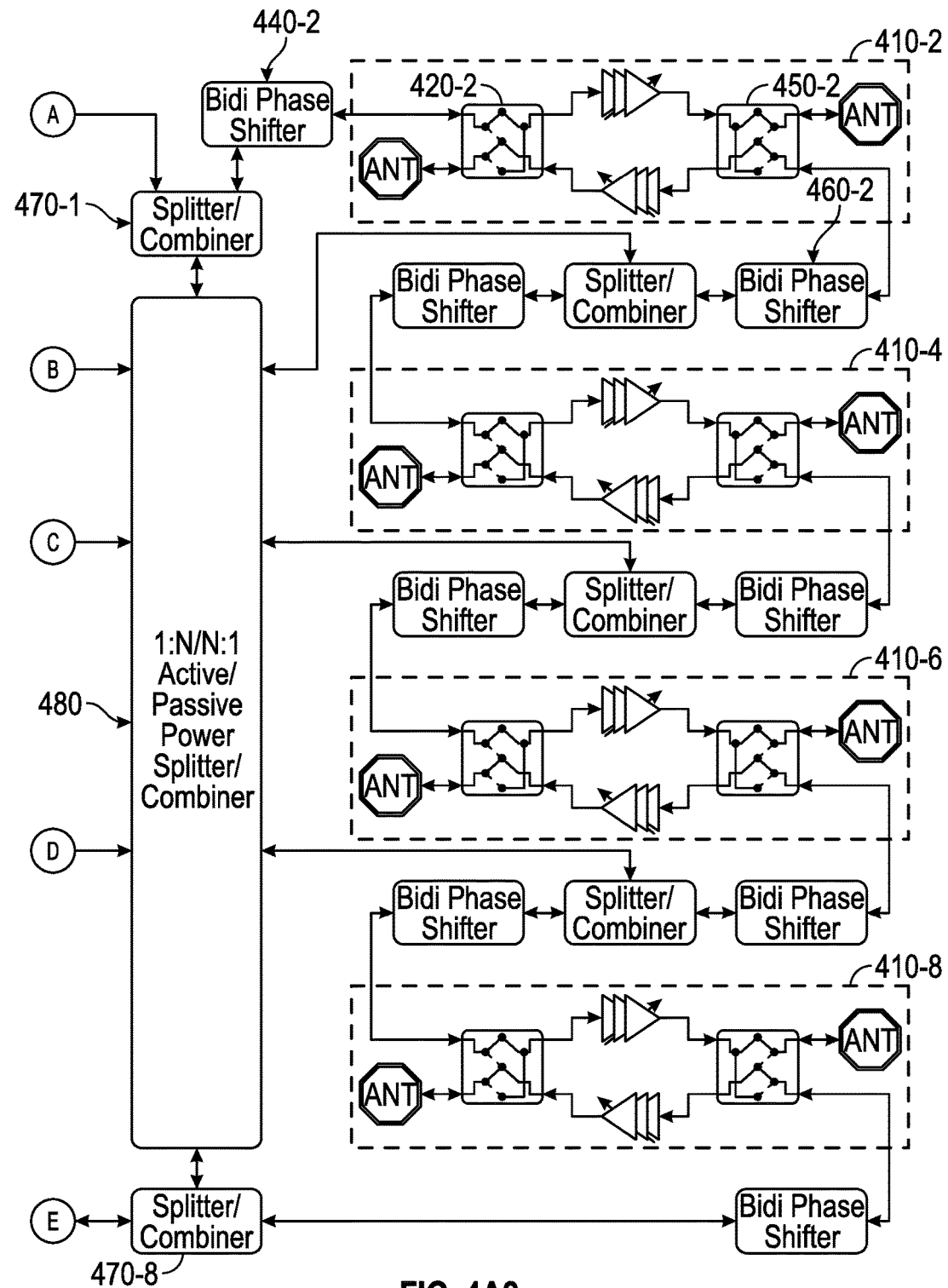
FIG. 4A2

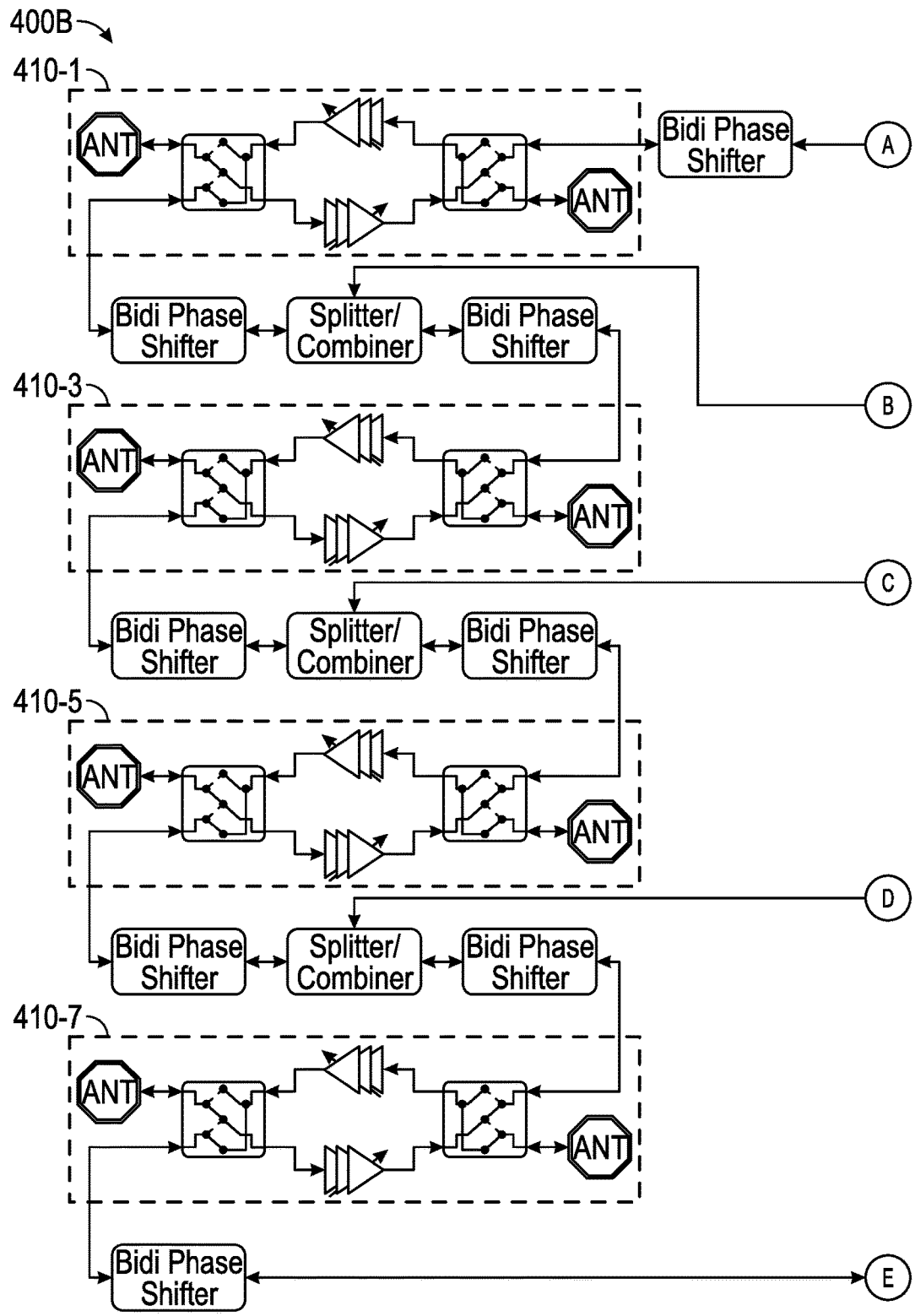
FIG. 4B1

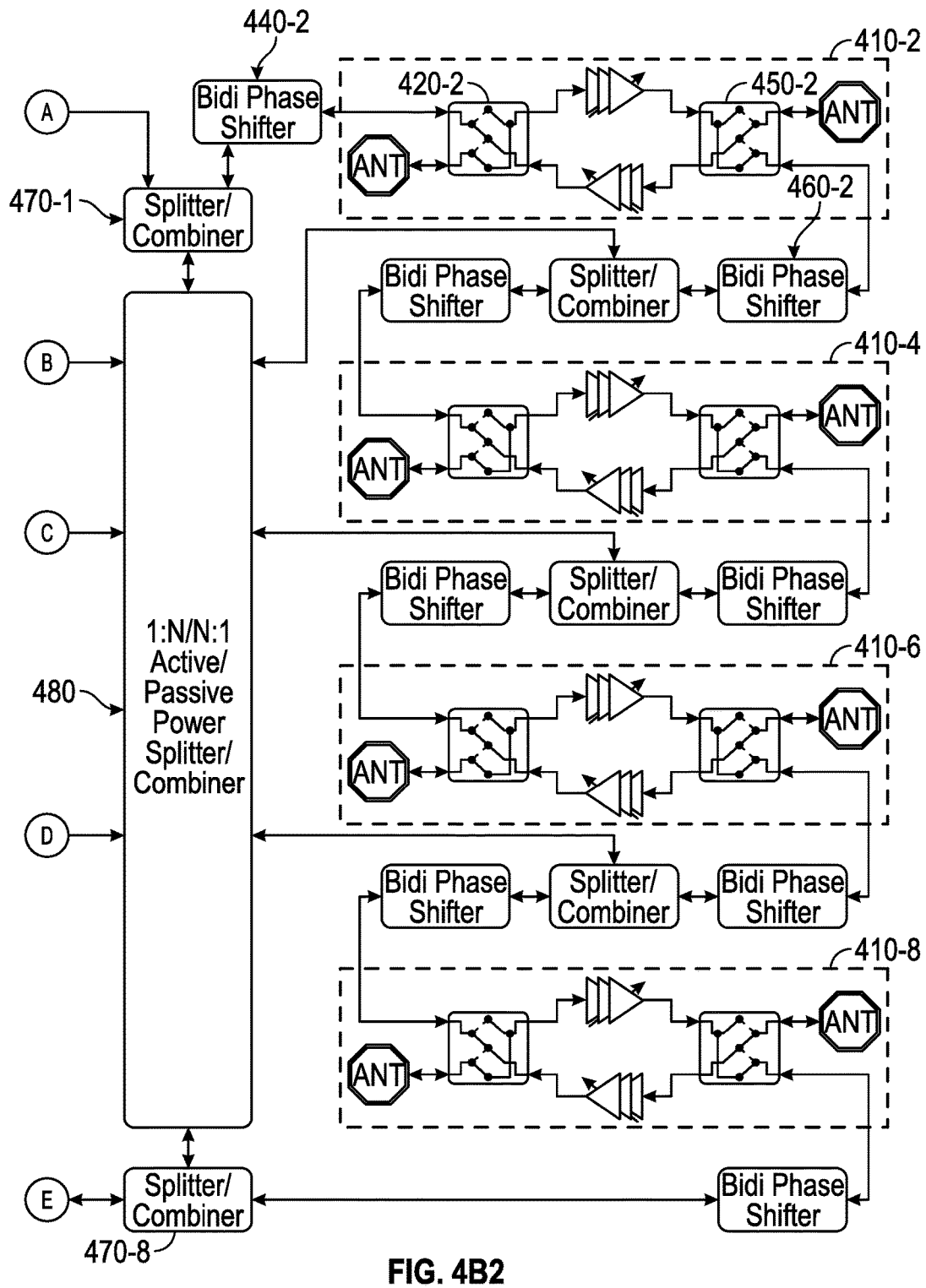
FIG. 4B2

BIDIRECTIONAL TRANSCEIVER CIRCUITS

CROSS-REFERENCE TO RELATED APPLICATIONS

This application claims the benefit of priority under 35 U.S.C. § 119 from U.S. Provisional Patent Application 62/337,834 filed May 17, 2016, which is incorporated herein by reference in its entirety.

TECHNICAL FIELD

The present description relates generally to wireless communications, and more particularly, to bidirectional time-division duplexing transceivers and phased array circuits.

BACKGROUND

As the use of telecommunication and the desire for higher speed data transfer is increased, new technologies for making higher speed communication device and systems are developed. For example, for short-range communications, wireless gigabit alliance (WiGig) protocol is viewed as a complement for high-speed Wi-Fi that can address short-range communication needs. The WiGig specification allows devices to communicate wirelessly at multi-gigabit speeds at 60 GHz. High performance wireless data display and audio applications can be enabled that supplement the capabilities of previous wireless LAN devices.

The WiGig technology at 60 GHz used for the latest wireless systems provides high-speed point-to-point connections, for example, for high definition and 3D TV signals from the set-top-box to a large screen TV. Further, the 60 GHz technology, built into smartphones and other portable devices, allows transfer of HD video from a portable device to a TV screen for display. Accordingly, there is a need for compact, low price, and broadband antennas for WiGig-enabled wireless devices.

To achieve the increased capacity offered by the wide bandwidth of a 60 GHz implementation, some of the losses associated with reduced wavelength need to be overcome, for example, by using multiple (e.g., 16 or 32) elements in a phased array. Time-division duplexing (TDD) systems operate as a transmitter (TX) or a receiver (RX) at any point in time. This implies blocks that are dedicated to operate in TX mode are unused in RX mode and blocks that are dedicated to operate in RX mode are unused in TX mode.

BRIEF DESCRIPTION OF THE DRAWINGS

Certain features of the subject technology are set forth in the appended claims. However, for purpose of explanation, several embodiments of the subject technology are set forth in the following figures.

FIGS. 2A-2B are high-level block diagrams illustrating example architectures of a two-element bidirectional transceiver in TX and receive RX modes of operation, according to aspects of the subject technology.

FIGS. 3A through 3C are block diagrams illustrating example implementations of a bidirectional phase shift circuit and a double-pole double throw (DPDT) switch, according to aspects of the subject technology.

FIGS. 4A1-4B2 are high-level block diagrams illustrating example architectures of a 16-element bidirectional transceiver in TX and RX modes of operation, according to aspects of the subject technology.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects of the subject technology, methods and circuits for bidirectional time-division duplexing transceivers and phased array circuits are provided. The subject technology enables making transceiver and/or phased-array building blocks including amplifiers, phase-shifters, mixers, and filters bidirectional, such that the same blocks are reused between TX and RX modes of operation of the transceiver. This allows die area reduction by up to a factor of two, which can be especially useful in phased arrays and other transceivers with multiple (e.g., 16) TX and RX elements. It is understood that passive blocks such as power splitter-combiners, passive filters, and the like are inherently bidirectional. The subject technology enables making active blocks bidirectional to enable compact phased arrays and/or transceivers. The subject technology includes a number of advantageous features. For example, the disclosed phased array architectures enable maximum reuse of blocks between TX and RX modes of operation. The same amplifier stages can be used as power amplifier (PA) stages in the TX mode, as low-noise amplifier (LNA) stages in the RX mode, and the same phase shifters and power combiners-splitters are reused in TX and RX modes.

Figure 1A:
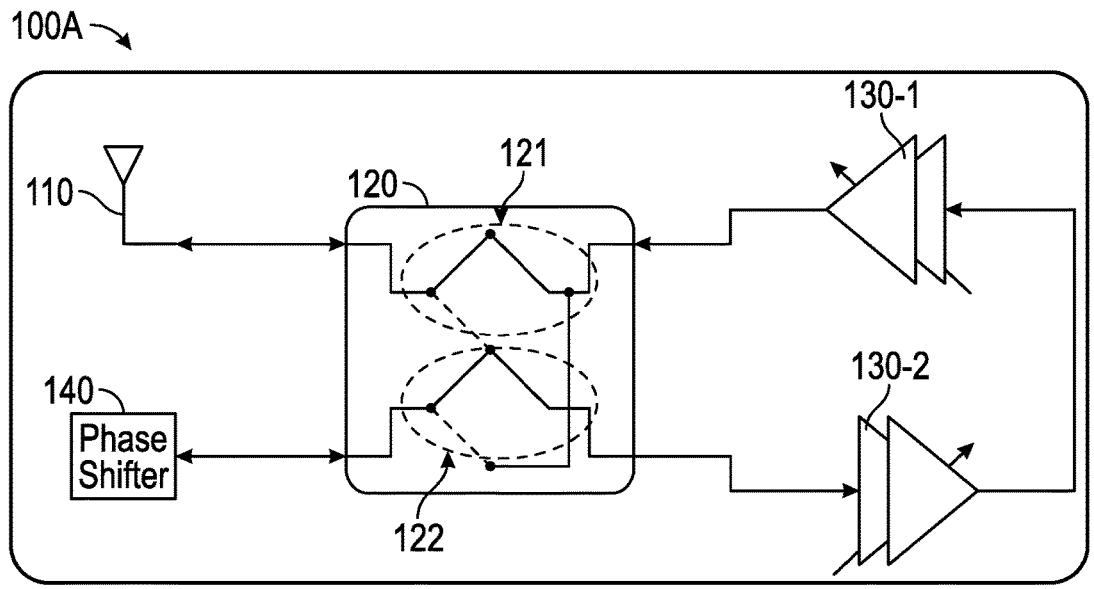
FIGS. 1A-1B are high-level block diagrams illustrating example architectures of a single-element bidirectional transceiver in transmitter (TX) and receiver (RX) modes of operation, according to aspects of the subject technology.
Figure 1B:
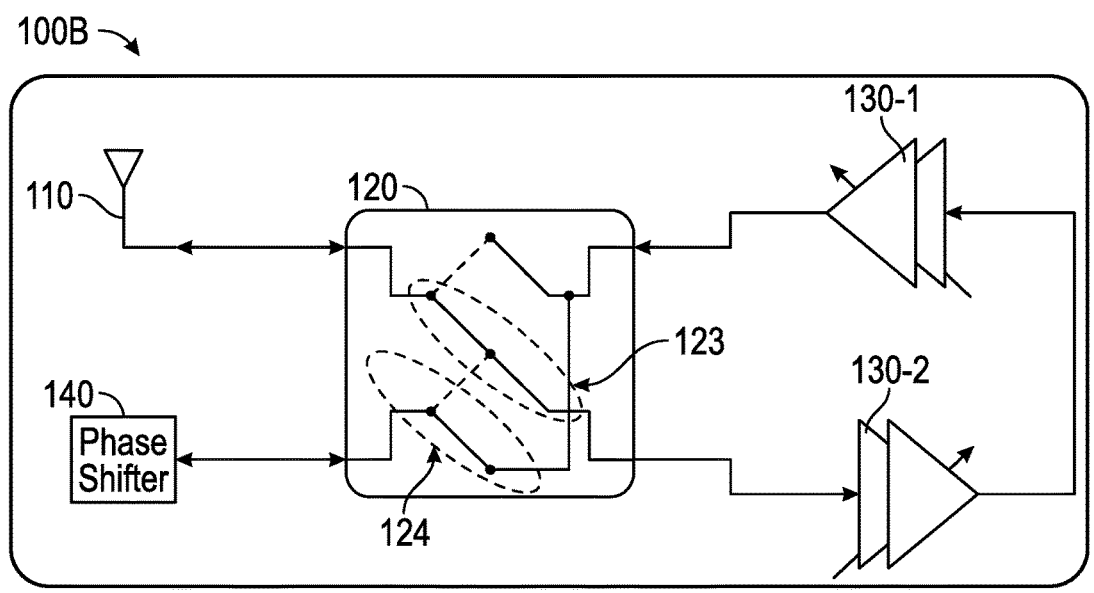

FIGS. 1A-1B are high-level block diagrams illustrating example architectures 100A and 100B of a single-element bidirectional transceiver in transmit (TX) and receive (RX) modes of operation, according to aspects of the subject technology. The architectures 100A of the single-element bidirectional transceiver shown in FIG. 1A includes a radio-frequency (RF) antenna 110, a double-pole-double-throw (DPDT) switch 120, amplifiers 130 (e.g., 130-1 and 130-2), and a phase shift circuit (e.g., a bidirectional phase-shift circuit) 140. The DPDT switch 120 includes four switches and at any instance of time, two of the four switches are closed. For example, in the TX mode, as shown in the architectures 100A, switches 121 and 122 are closed to provide a TX signal path for RF signals from the phase shift circuit 140 through amplifiers 130 to the RF antenna 110. The RF signals can be provided by bidirectional mixers described herein. In the TX mode of operation, shown in FIG. 1A, the amplifiers 130 are used as power amplifiers.

The architectures 100B of the single-element bidirectional transceiver shown in FIG. 1B is similar to the transceiver architecture 100A discussed above, except that in the RX mode of operation, as shown in FIG. 1B, different switches (e.g., 123 and 124) are closed. The closed switches 123 and 124 provide an RX signal path for RF signals from the RF antenna 110 to the phase shift circuit 140 through amplifiers 130. The RF signals received at the phase shift circuit 140 are processed and provided to the bidirectional mixers as described herein. As seen from FIGS. 1A and 1B, the same amplifiers 130, phase shift circuit 140, DPDT switch 120, and RF antenna 110 are used both for both TX and RX modes, which occur in two different time-division-duplexing (TDD) time slots. In the RX mode of operation, shown in FIG. 1B, the amplifiers 130 are used as LNAs.

In some aspects, the amplifiers 130 are variable gain multi-stage bidirectional amplifiers. In the TX mode of operation, the amplifiers 130 are acting as power amplifier (PA) circuits. The level of the signal in the line-up of stages of each element can be designed such that the 1-dB compression output-power point (OP1 dB) of the PA stages and the OP1 dB point of the LNA stages are close enough that a final stage of the amplifier (e.g., 130-1) can be designed with proper flexibility to address both values, while the input stage of the amplifier (130-2) is optimized for minimizing noise in the RX mode.

FIGS. 2A-2B are high-level block diagrams illustrating example architectures 200A and 200B of a two-element bidirectional transceiver in TX and RX modes of operation, according to aspects of the subject technology. The architecture 200A of the two-element bidirectional transceiver includes RF antennas 210 and 212, DPDT switches 220 and 250, amplifiers 230 (e.g., 230-1 and 230-2), and a phase shift circuits (e.g., a bidirectional phase shift circuits) 240 and 260. The DPDT switches 220 and 250 are similar to the DPDT switch 120 of FIG. 1A, and in the TX mode of operation of the transceiver, as shown in the architecture 200A, switches 221 and 251 are closed. The closed switches 221 and 251 provide a first TX signal path for first RF signals from the phase shift circuit 260 through amplifier 230-1 to the RF antenna 210, and a second TX signal path for second RF signals from the phase shift circuit 240 through amplifier 230-2 to the RF antenna 212. The RF signals can be provided by bidirectional mixers described herein. In the TX mode of operation, shown in FIG. 2A, the amplifiers 230 are used as power amplifiers.

The architecture 200B of the two-element bidirectional transceiver is similar to the transceiver architecture 200A discussed above, except that in the RX mode of operation, as shown in FIG. 2B, different switches (e.g., 222 and 252) are closed. The closed switches 222 and 252 provide a first RX signal path for RF signals from the RF antenna 210 to the phase shift circuit 260 through amplifier 230-2, and a second RX signal path for RF signals from the RF antenna 212 to the phase shift circuit 240 through amplifier 230-1. The RF signals received at the phase shift circuit 240 and 260 are processed and provided to the bidirectional mixers as described herein. As seen from FIG. 2A of the TX mode, the amplifier 230-1 is operating as a PA of a first element of a two-element transmitter (e.g., including phase shift circuit 260 and RF antenna 210) and the amplifier 230-2 is operating as a PA of a second element of the two-element transmitter (e.g., including the phase shift circuit 240 and the RF antenna 212). In the RX mode, shown in FIG. 2B, the amplifier 230-1 is operating as an LNA of the second element (e.g., including the RF antenna 212 and the phase shift circuit 240) of a two-element receiver and the amplifier 230-2 is operating as an LNA the first element (e.g., including the RF antenna 210 and phase shift circuit 260) of the two-element receiver. In other words, in the two-element bidirectional transceivers of FIGS. 2A and 2B, both elements are used both in RX and TX modes, but in different TDD time slots. The phase shift circuits 240 and 260 are coupled via splitter-combiner circuits and a main active/passive power combiner-divider circuit to a bidirectional mixer circuit disclosed herein.

FIGS. 3A through 3C are block diagrams illustrating example implementations of a bidirectional phase shift circuit and a DPDT switch, according to aspects of the subject technology. The 300A of the bidirectional phase shift circuit as shown in FIG. 3A includes a 90 degree hybrid 310, two invertible passive attenuators 320 (e.g., 320-1 and 320-2), and a power combiner-splitter 330. Is some aspects, the bidirectional phase shift circuit 300A is a high-frequency (e.g., 60 GHz) phase shift circuit. The 90 degree hybrid 310 is a bidirectional circuit including input/output differential ports 302, 306, and 308. An input signal at input port 302 is equally split with a resultant 90° phase shift between output ports 306 and 308, and signals entering the output ports 306 and 308 are combined while maintaining high isolation between the ports. The invertible passive attenuators 320-1 and 320-2 are known circuits. In some implementations, the power combiner-splitter 330 can be a Wilkinson power combiner-splitter circuit. The Wilkinson circuit, when used as a power splitter, can achieve isolation between the output ports while maintaining a matched condition on all ports. The Wilkinson circuit can be made of passive components, therefore, can be applied as a power combiner as well. In some implementations, the bidirectional phase shift circuit 300A has a loss of about 11 dB and a resolution of about 5.626 degrees (e.g., 64 steps).

In some aspects, the DPDT switch (e.g., 220 and 250 of FIGS. 2A and 2B) can be realized as shown in the implementations 300B and 300C of FIGS. 3B and 3C. The implementation 300B includes four switches S1 through S4, eight transmission lines TL1 through TL8, a phase-shifter port 340, an antenna port 342, an amplifier input port 344 and an amplifier output port 346. The configuration shown in FIG. 3B represent a TX mode, in which SPDT switches S1 and S2 are open (non-conducting) and SPDT switches S3 and S4 are closed (conducting). In the RX mode, the SPDT switches are toggled to have the SPDT switches S1 and S2 closed and the SPDT switches S3 and S4 open. In the TX mode shown in FIG. 3B, the signal from the phase-shifter port 340 passes through the transmission line stubs TL1 and TL2 to the amplifier input port 344 to an amplifier (e.g., 230-2 of FIG. 2A). The amplifier output port 346 is coupled to an output of an amplifier (e.g., 230-1 of FIG. 2A), and the signal at the amplifier output port 346 passes through the transmission line stubs TL3 and TL4 to the antenna port 342. In some implementations, the transmission line stubs TL1 through TL8 are quarter wavelength (λ/4) stubs.

In one or more implementations, as shown in FIG. 3C, the TL1 through TL8 are replaced with inductors L1 through L8. The configuration shown in FIG. 3C represent a TX mode, in which SPDT switches S1 and S2 are open and SPDT switches S3 and S4 are closed. In the RX mode, the SPDT switches are toggled to have the SPDT switches S1 and S2 closed and the SPDT switches S3 and S4 open. The operation of the implementation 300C is similar to the operation of the implementation 300B described above.

FIGS. 4A-4B are high-level block diagrams illustrating example architectures 400A and 400B of a 16-element bidirectional transceiver in transmit TX and receive RX modes of operation, according to aspects of the subject technology. In some aspects, a larger equivalent isotropically radiated power (EIRP) is achieved by having multiple slices (e.g., elements) of transceivers, for example, 16-elements, or 32-elements. The EIRP is understood to be the amount of power that an isotropic antenna (emitting power equally in all directions) would emit to produce the peak power density observed in the direction of maximum antenna gain. The EIRP can take into account the losses in transmission line and connectors and includes the gain of the antenna.

For example, in the 60 GHz phased-array transceiver of the subject technology, there can be many slices of TX and RX corresponding to 16 element or 32 element arrays. In some aspects, the TX portion includes power dividers followed by phase shifters and PA stages connecting to multiple antennas. In the RX mode, the antennas are coupled to LNA stages, followed by phase-shifters and power combiners. The disclosed implementations allow the reuse of the same circuitry in either TX or RX modes, as described below.

The 16-element bidirectional transceiver shown in the architecture 400A includes eight two-element bidirectional transceivers 410 (e.g., 410-1 through 410-8) that are structurally and functionality similar and are operating in TX mode. Each two-element bidirectional transceiver 410 is similar to the architecture 200A of the two-element bidirectional transceiver discussed above. For example, the closing configuration of DPDT switches 420-2 and 450-2 of the two-element bidirectional transceiver 410-2 are the same as the DPDT switches 220 and 250 of FIG. 2A and can be implemented as shown and described above with respect to FIGS. 3B and 3C. In some aspects, each bidirectional phase shift circuit (e.g., 440-1, 440-2, or 460-2) is coupled to a splitter-combiner circuit 470 (e.g., 470-1 or 470-8) that is in turn coupled to a main active/passive power combiner-divider circuit 480.

The implementation of bidirectional phase shift circuits are similar to the bidirectional phase shift circuit 300A of FIG. 3A. The main active power combiner-divider circuit 480 couples the splitter-combiners 470 (e.g., 470-1 or 470-8) to a mixer circuit, as described below. The main active power combiner-divider circuit 480 includes know blocks such as a Wilkinson power combiner-divider, one or more single pole-double-throw (SPDT) switches, a pre-power-amplifier (prePA) stage, a post-combiner low-noise-amplifier (pcLNA), and a flip-chip input-output (I/O) port. In the TX mode, the output RF signal from the up-conversion mixer is amplified by the prePA stage and is delivered through the splitter-combiners 480 and 470 to the bidirectional phase shift circuits 440.

The 16-element bidirectional transceiver shown in the architecture 400B includes eight two-element bidirectional transceivers 410 (e.g., 410-1 through 410-8) that are structurally and functionality similar and are operating in RX mode. Each two-element bidirectional transceiver 410 is similar to the two-element bidirectional transceivers of the architecture 200B discussed above. For example, the closing configuration of DPDT switches 420-2 and 450-2 of the two-element bidirectional transceiver 410-2 are the same as the DPDT switches 220 and 250 of FIG. 2B and can be implemented as shown and described above with respect to FIGS. 3B and 3C. In some aspects, each bidirectional phase shift circuit (e.g., 440-1, 440-2, or 460-2) is coupled to the splitter-combiner circuit 470 (e.g., 470-1 or 470-8) that is in turn coupled to the main active power combiner-divider circuit 480. In the RX mode, the RF output signal from the two-element bidirectional transceivers 410 are combined first, amplified by the pcLNA stages and then delivered to the down-conversion mixer.

The disclosed technology allows chip area to be reduced by almost a factor of two, as components of each element of the multi-element transceiver are used both in TX and RX mode. In other words, for the same given die area almost twice the number of active slices of TX and RX can provided, effectively allowing the link budget to increase by about 30×log 10(2)=9 dB. The link budget accounts for the entire gains and losses from the transmitter to the receiver including antenna gains, propagation attenuation, feedline, and miscellaneous losses.

For 60 GHz phased-array transceivers, the area of the transceiver is particularly important and is considered a differentiating feature of the transceiver. In some implementations, the disclosed technology would allow realization of active antenna module of a 32-element 60 GHz phased array transceiver on a chip area of, for example, less than about 5 $mm^2$.

Figure 5B:
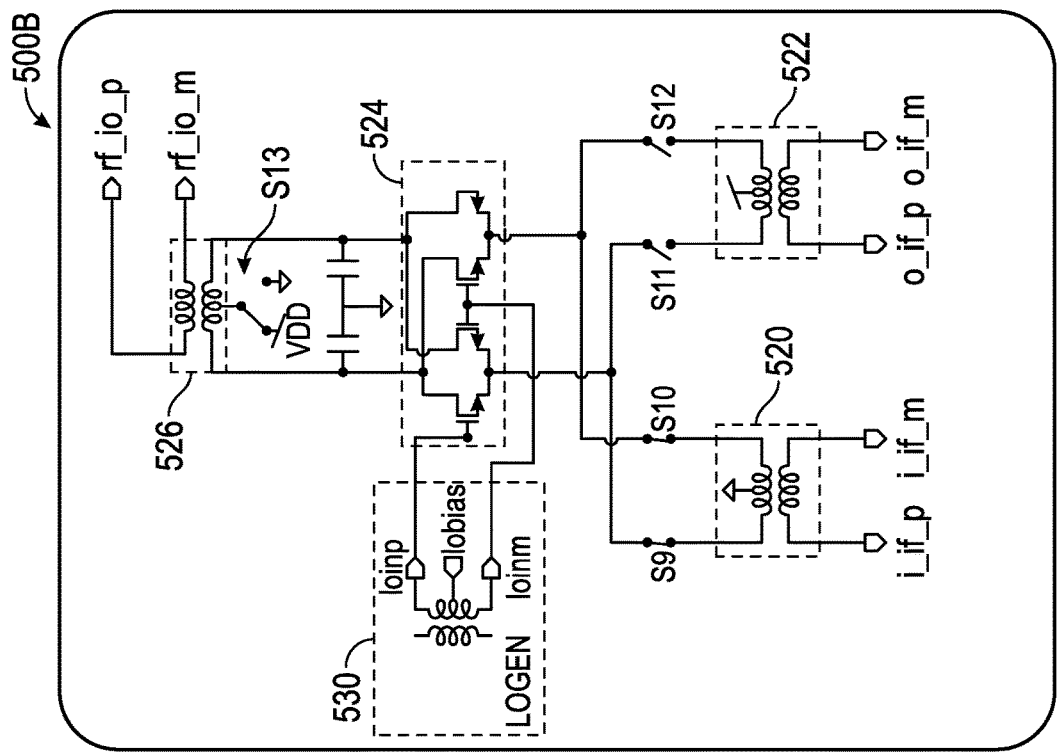
FIGS. 5A-5B are schematic diagrams illustrating example implementations of a bidirectional mixer circuit, according to aspects of the subject technology.
Figure 5A:
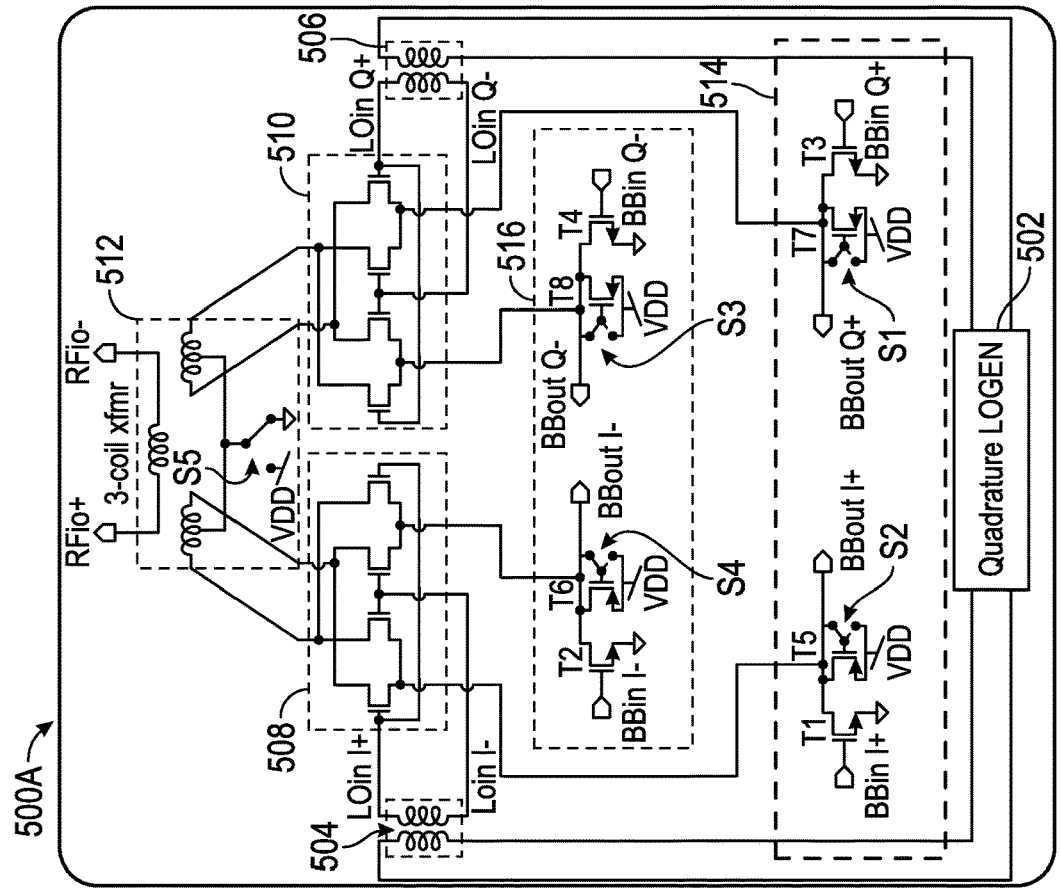

FIGS. 5A-5B are schematic diagrams illustrating example implementations 500A and 500B of a bidirectional mixer circuit, according to aspects of the subject technology. The implementation 500A of FIG. 5A is for a direct conversion mixer and includes a quadrature local oscillator generator (LOGEN) 502, LO in-phase (I) and quadrature (Q) transformers 504 and 506, I and Q mixer cells 508 and 510, a combiner block 512, and baseband (BB) input/output (IO) blocks 514 and 516. The LOGEN 502 is a known circuit and is used for both TX and RX modes. The I and Q LO signals generated by the LOGEN 502 are differential signals (denoted by + and − signs) and are coupled to the I and Q mixer cells 508 and 510 via the LO I and Q transformers 504 and 506, respectively.

In some aspects, the I and Q mixer cells 508 and 510 are known Gilbert cells that receive I and Q LO signals from the I and Q LO transformers 504 And 506, respectively. The I and Q RF signals from the I and Q mixer cells 508 and 510 are combined, via inductive coupling, by the combiner block 512 to produce the output RF signal, which is a differential signal (e.g., RFio+ and RFio− signals). The combiner block 512 is a three-coil on-chip transformer, although other combiner circuits can be used.

In the TX mode, I and Q BB inputs signals (e.g., differential signals) are applied through gate terminals of transistors (e.g., NMOS transistors) T1 (e.g., Bin I+ signal), T2 (e.g., Bin I− signal), T3 (e.g., Bin Q+ signal), and T4 (e.g., Bin Q− signal) to the I and Q mixer cells 508 and 510. In the RX mode, I and Q BB output signals (e.g., differential signals) are received from drain terminals of transistors (e.g., PMOS transistors) T5 (e.g., Bout I+ signal), T6 (e.g., Bout I− signal), T7 (e.g., Bout Q+ signal), and T8 (e.g., Bout Q− signal) that are coupled to respective output nodes of the I and Q mixer cells 508 and 510. The symmetry in CMOS transistors of the I and Q mixer cells 508 and 510 enables the mixer cells to be bidirectional, and the switches S1, S2, S3, S4, and S5 allow swapping of the power supply (VDD) and ground connection to the mixer cells 508 and 510. For example, in the TX mode, switches S1, S2, S3, S4 and S5 are in opposite positions to those shown in FIG. 5A. The power supply VDD is applied to I and Q mixer cells 508 and 510 through S5 and the center taps in the 3-coil transformer. In the TX mode, PMOS transistors T5, T6, T7 and T8 are turned off using S1, S2, S3 and S4, while transistors T1, T2, T3 and T4 act as an input transconductance stage. In the RX mode, switches S1, S2, S3, S4, and S5 toggle to the positions shown in FIG. 5A. In RX mode, the ground connection of the mixer cells 508 and 510 is provided through S5 and the center taps in the 3-coil transformer, whereas switches S1, S2, S3, and S4 enable diode-connected load PMOS transistors T5, T6, T7, and T8.

Advantageous features of the implementation 500A include using a single quadrature LOGEN, and a single I and Q mixer cell for both RX and TX modes of operation, which significantly reduce the chip real estate and power consumption.

The implementation 500B of FIG. 5B is for a heterodyne mixer and includes a LOGEN coupling transformer 530, an intermediate frequency (IF) input transformer 520, an IF output transformer 522, a mixer cells 524, an RF input/output transformer 526, and switches S9, S10, 511, S12, and S13. Differential LO signals (e.g., LOinp and LOinm) are provided by a LOGEN (not shown) and are coupled to LO inputs of the mixer cell 524 via the LOGEN coupling transformer 530. The mixer cell 524 is a bidirectional mixer cell that is used both in TX and RX modes. In the TX mode (as shown in FIG. B), switches S9 and S10 are closed (conducting), which allow differential IF input signals (e.g., i-IF-p and i-IF-m) to be applied through the IF input transformer 520 to IF inputs of the mixer cell 524. The switches S9 and S10, further allow coupling the mixer cell 524 to the ground potential, which is provided through a center tap of secondary coil of the IF input transformer 520. In the RX mode, switches S9, S10, S11, S12, and S13 toggle to an opposite position. For example, the switch S13 provides ground connection for the mixer cell 524, whereas switches S11 and S12 would enable connection to VDD that is provided through a center tap of secondary coil of the IF output transformer 522. The closing of switches S11 and S12, in the RX mode, further allows coupling of the IF output transformer 522 to the IF outputs of the mixer cell 524. The RF input/output transformer 526 is by nature bidirectional, and allows RF signals pass in and out of the mixer cell 524 and RF IO ports (e.g., rf_io_p, and rf_io_m), in RX and TX modes, respectively.

Advantageous features of the implementation 500B include using a single LOGEN, a single LOGEN coupling transformer, and a single mixer cell for both RX and TX modes of operation, therefore allowing a significant reduction in the chip real estate and power consumption.

Figure 6:
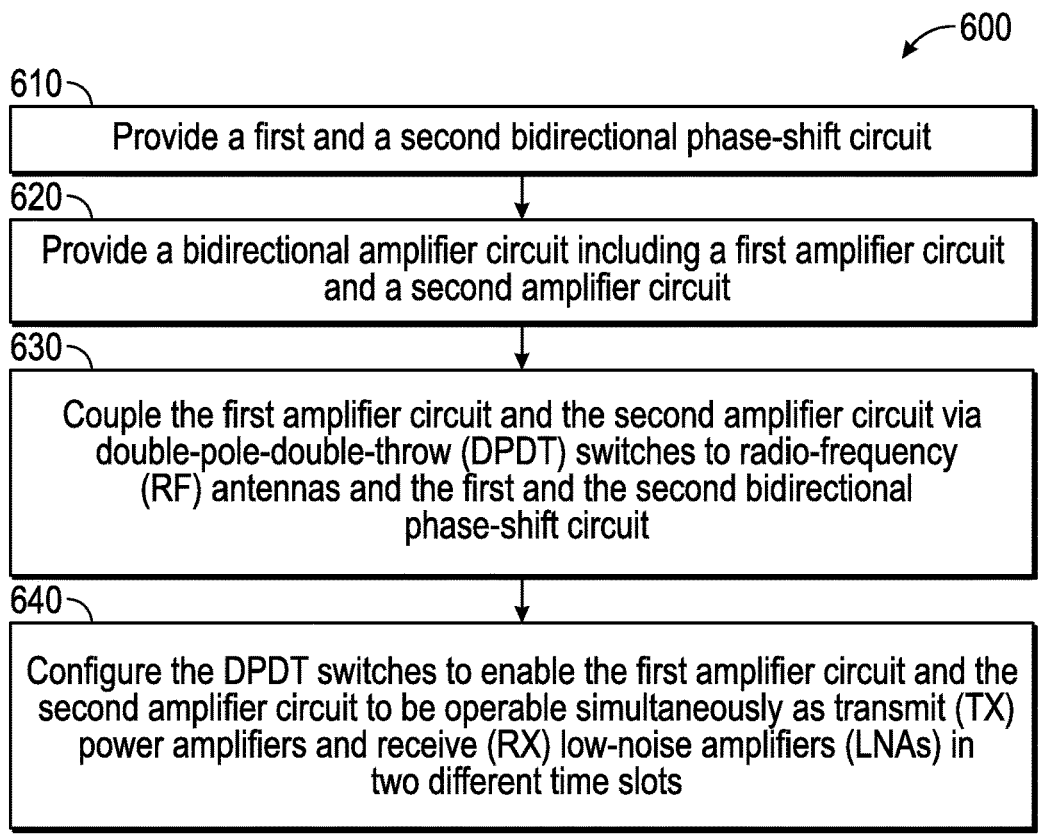
FIG. 6 is flow diagram illustrating a method of providing a bidirectional time-division duplexing transceiver circuit, according to aspects of the subject technology.

FIG. 6 is flow diagram illustrating a method 600 of providing a bidirectional time-division duplexing transceiver circuit (e.g., 200A of FIG. 2A or 200B of FIG. 2B), according to aspects of the subject technology. The method 600 starts with providing a first and a second bidirectional phase-shift circuit (e.g., 240 and 260 of FIG. 2A) (610). A bidirectional amplifier circuit (e.g., 230 of FIG. 2A), including a first amplifier circuit (e.g., 230-1 of FIG. 2A), and a second amplifier circuit (e.g., 230-2 of FIG. 2A), is provided (620). The first amplifier circuit and the second amplifier circuit are coupled via DPDT switches (e.g., 220 and 250 of FIG. 2A) to RF antennas (e.g., 210 and 212 of FIG. 2A) and the first and the second bidirectional phase-shift circuits (e.g., 240 and 260 of FIG. 2A) (630). The DPDT switches enable the first amplifier circuit and the second amplifier circuit to be operable simultaneously as TX power amplifiers (e.g., as shown in FIG. 2A) and RX LNAs (e.g., as shown in FIG. 2B), in two different time slots (640).

Figure 7:
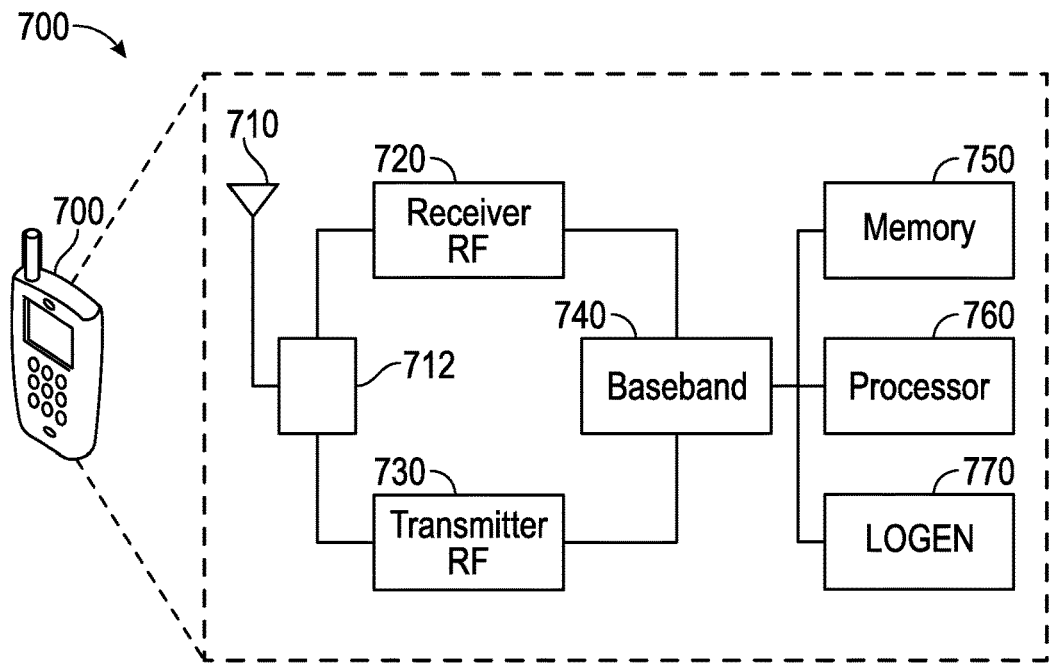
FIG. 7 is a block diagram illustrating an example wireless communication device in accordance with one or more implementations of the subject technology.

FIG. 7 is a block diagram illustrating an example wireless communication device 700 in accordance with one or more implementations of the subject technology. The wireless communication device 700 may comprise a radio-frequency (RF) antenna 710, a receiver 720, a transmitter 730, a baseband processing module 740, a memory 750, a processor 760, and a local oscillator generator (LOGEN) 770. In various embodiments of the subject technology, one or more of the blocks represented in FIG. 7 may be integrated on one or more semiconductor substrates. For example, the blocks 720-770 may be realized in a single chip or a single system on chip, or may be realized in a multi-chip chipset.

The RF antenna 710 may be suitable for transmitting and/or receiving RF signals (e.g., wireless signals) over a wide range of frequencies. Although a single RF antenna 710 is illustrated, the subject technology is not so limited.

The receiver 720 may comprise suitable logic circuitry and/or code that may be operable to receive and process signals from the RF antenna 710. The receiver 720 may, for example, be operable to amplify and/or down-covert received wireless signals. In various embodiments of the subject technology, the receiver 720 may be operable to cancel noise in received signals and may be linear over a wide range of frequencies. In this manner, the receiver 720 may be suitable for receiving signals in accordance with a variety of wireless standards, such as Wi-Fi, WiMAX, Bluetooth, WiGig, and various cellular standards. In various embodiments of the subject technology.

The transmitter 730 may comprise suitable logic circuitry and/or code that may be operable to process and transmit signals from the RF antenna 710. The transmitter 730 may, for example, be operable to up-covert baseband signals to RF signals and amplify RF signals. In various embodiments of the subject technology, the transmitter 730 may be operable to up-convert and amplify baseband signals processed in accordance with a variety of wireless standards. Examples of such standards may include Wi-Fi, WiMAX, Bluetooth, WiGig, and various cellular standards. In various embodiments of the subject technology, the transmitter 730 may be operable to provide signals for further amplification by one or more power amplifiers.

In some aspects, the operation in WiGig standard allows the wireless communication device 700 to communicate wirelessly at multi-gigabit speeds at 60 GHz. In such applications, the receiver 720 and the transmitter 730 can be implemented as a multi-element phased array transceivers (e.g., 400A and 400B of FIGS. 4A and 4B) using two-element bidirectional transceiver (e.g., 200A and 200B of FIGS. 2A and 2B), bidirectional phase shifters (e.g., 300A of FIG. 3A), DPDT switches (e.g., 300B and 300C of FIGS. 3A and 3B), and bidirectional mixers (e.g., 500A and 500B of FIGS. 5A and 5B). The implementation of the receiver 720 and the transmitter 730 based on the subject technology has the benefit of reduced chip real estate and increased link budget, among other benefits.

The duplexer 712 may provide isolation in the transmit band to avoid saturation of the receiver 720 or damaging parts of the receiver 720, and to relax one or more design requirements of the receiver 720. Furthermore, the duplexer 712 may attenuate the noise in the receive band. The duplexer may be operable in multiple frequency bands of various wireless standards.

The baseband processing module 740 may comprise suitable logic, circuitry, interfaces, and/or code that may be operable to perform processing of baseband signals. The baseband processing module 740 may, for example, analyze received signals and generate control and/or feedback signals for configuring various components of the wireless communication device 700 such as the receiver 720. The baseband processing module 740 may be operable to encode, decode, transcode, modulate, demodulate, encrypt, decrypt, scramble, descramble, and/or otherwise process data in accordance with one or more wireless standards.

The processor 760 may comprise suitable logic, circuitry, and/or code that may enable processing data and/or controlling operations of the wireless communication device 700. In this regard, the processor 760 may be enabled to provide control signals to various other portions of the wireless communication device 700. The processor 760 may also control transfers of data between various portions of the wireless communication device 700. Additionally, the processor 760 may enable implementation of an operating system or otherwise execute code to manage operations of the wireless communication device 700. In one or more aspects that processor 760 may control the operation (e.g., closing or opening of various FET switches) of the circuits of the subject technology, for example, FET switches SM1, SM2, S1-S4, and S8 of FIG. 3 or FET switches of other figures disclosed herein. In one or more implementations, the processor 760 can perform the functionalities of the modulation control circuit 126 of FIG. 1.

The memory 750 may comprise suitable logic, circuitry, and/or code that may enable storage of various types of information such as received data, generated data, code, and/or configuration information. The memory 750 may comprise, for example, RAM, ROM, flash, and/or magnetic storage. In various embodiment of the subject technology, Information stored in the memory 750 may be utilized for configuring the receiver 720 and/or the baseband processing module 740.

The local oscillator generator (LOGEN) 770 may comprise suitable logic, circuitry, interfaces, and/or code that may be operable to generate one or more oscillating signals of one or more frequencies. The LOGEN 770 may be operable to generate digital and/or analog signals. In this manner, the LOGEN 770 may be operable to generate one or more clock signals and/or sinusoidal signals. Characteristics of the oscillating signals such as the frequency and duty cycle may be determined based on one or more control signals from, for example, the processor 760 and/or the baseband processing module 740.

In operation, the processor 760 may configure the various components of the wireless communication device 700 based on a wireless standard according to which it is desired to receive signals. Wireless signals may be received via the RF antenna 710 and amplified and down-converted by the receiver 720. The baseband processing module 740 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 750, and/or information affecting and/or enabling operation of the wireless communication device 700. The baseband processing module 740 may modulate, encode and perform other processing on audio, video, and/or control signals to be transmitted by the transmitter 730 in accordance to various wireless standards.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A bidirectional time-division duplexing transceiver circuit, the transceiver circuit comprising:
   a first and a second bidirectional phase-shift circuit; and
   a bidirectional amplifier circuit including a first amplifier circuit and a second amplifier circuit, wherein the first amplifier circuit and the second amplifier circuit are connected to double-pole-double-throw (DPDT) switches, wherein a first DPDT switch is configured to connect the first amplifier circuit to a first radio-frequency (RF) antenna and a second DPDT switch is configured to connect the second amplifier circuit to a second RF antenna, and wherein the first and the second bidirectional phase-shift circuit and the DPDT switches are configured to enable the first amplifier circuit and the second amplifier circuit to be operable simultaneously as transmit (TX) path amplifiers in a first time slot and as a receive (RX) path amplifiers in a second time slot.

2. The transceiver circuit of claim 1, wherein the first amplifier circuit is coupled via a first DPDT switch to the first bidirectional phase-shift circuit, wherein the first and second DPDT switches are implemented using four single pole-double-throw (SPDT) switches and a plurality of transmission line stubs.

3. The transceiver circuit of claim 1, the second amplifier circuit is coupled via a second DPDT switch to the second bidirectional phase-shift circuit, wherein the first and second DPDT switches are implemented using four SPDT switches using plurality of inductors, and wherein each of the plurality of inductors is realized using a transmission line stub.

4. The transceiver circuit of claim 1, further comprising a first and a second splitter-combiner circuits coupled to the first and the second bidirectional phase-shift circuit, respectively, and wherein the first splitter-combiner circuit is configured to couple the transceiver circuit to a main active power combiner-divider circuit.

5. The transceiver circuit of claim 4, wherein the second splitter-combiner circuit is configured to couple the transceiver circuit to a similar bidirectional time-division duplexing transceiver circuit, and wherein the main active power combiner-divider circuit is configured to configured to couple a plurality of the similar bidirectional time-division duplexing transceiver circuits to a mixer block.

6. The transceiver circuit of claim 5, wherein the main active power combiner-divider circuit comprises a Wilkinson power combiner-divider, one or more single pole-double-throw (SPDT) switches, a pre-power-amplifier (prePA) stage, a post-combiner low-noise-amplifier (pcLNA), and a flip-chip input-output (I/O) port.

7. The transceiver circuit of claim 5, wherein the mixer block comprises a bidirectional heterodyne mixer, and wherein the bidirectional heterodyne mixer uses a single mixer circuit and a single local oscillator generator (LOGEN) circuit for both TX and RX modes of operation.

8. The transceiver circuit of claim 5, wherein the mixer block comprises a bidirectional direct-conversion mixer, wherein the bidirectional direct-conversion mixer uses a single in-phase (I) mixer circuit, a single quadrature (Q) mixer circuit, and a single LOGEN circuit for both TX and RX modes of operation, and wherein mixer block further comprises a 3-coil transformer configured to couple the I and Q mixer circuits to the main active power combiner-divider circuit.

9. The transceiver circuit of claim 8, wherein the bidirectional direct-conversion mixer further comprises a plurality of transistor switches configured to enable changing bias voltage connection of the I and Q mixer circuits.

10. A bidirectional time-division duplexing transceiver circuit, the transceiver circuit comprising:
a plurality of double-slice transceiver circuits; and
a main active power combiner-divider circuit, wherein a double-slice transceiver circuit of the plurality of double-slice transceiver circuits comprises:
a first and a second splitter-combiner circuit;
a first bidirectional phase-shift circuit coupled to the first splitter-combiner circuit;
a second bidirectional phase-shift circuit coupled to the second splitter-combiner circuit;
a first amplifier circuit coupled via a first double-pole-double-throw (DPDT) switch to the first bidirectional phase-shift circuit and coupled via a second DPDT switch to a first radio-frequency (RF) antenna; and a second amplifier circuit coupled via the first DPDT switch to a second RF antenna and coupled via the second DPDT switch to the second bidirectional phase-shift circuit, wherein the first and the second splitter-combiner circuits are configured to couple the double-slice transceiver circuit and another double-slice transceiver circuit of the plurality of double-slice transceiver circuits to the main active power combiner-divider circuit.

11. The transceiver circuit of claim 10, wherein the main active power combiner-divider circuit comprises a Wilkinson power combiner-divider, one or more single pole-double-throw (SPDT) switches, a pre-power-amplifier (prePA) stage, a post-combiner low-noise-amplifier (pcLNA), and a flip-chip input-output (I/O) port.

12. The transceiver circuit of claim 10, wherein the main active power combiner-divider circuit and is configured to couple the plurality of double-slice transceiver circuits to a mixer block.

13. The transceiver circuit of claim 12, wherein the mixer block comprises a bidirectional heterodyne mixer, and wherein the bidirectional heterodyne mixer uses a single mixer circuit and a single local oscillator generator (LOGEN) circuit for both TX and RX modes of operation.

14. The transceiver circuit of claim 12, wherein the mixer block comprises a bidirectional direct-conversion mixer, wherein the bidirectional direct-conversion mixer uses a single in-phase (I) mixer circuit, a single quadrature (Q) mixer circuit, and a single LOGEN circuit for both TX and RX modes of operation.

15. The transceiver circuit of claim 12, wherein the mixer block further comprises a 3-coil transformer configured to couple the single I mixer circuit and the single Q mixer circuit to the main active power combiner-divider circuit.

16. The transceiver circuit of claim 14, wherein the bidirectional direct-conversion mixer further comprises a plurality of transistor switches configured to enable changing bias voltage connection of the single I mixer circuit and the single Q mixer circuit.

17. A method of providing a bidirectional time-division duplexing transceiver circuit, the method comprising:
providing a first and a second bidirectional phase-shift circuit;
providing a bidirectional amplifier circuit including a first amplifier circuit and a second amplifier circuit;
connecting the first amplifier circuit and the second amplifier circuit via double-pole-throw (DPDT) switches to radio-frequency (RF) antennas and the first and the second bidirectional phase-shift circuit by configuring a first DPDT switch to connect the first amplifier circuit to a first radio-frequency (RF) antenna and configuring a second DPDT switch to connect the second amplifier circuit to a second RF antenna; and
configuring the DPDT switches to enable the first amplifier circuit and the second amplifier circuit to be operable simultaneously as transmit (TX) power amplifiers and receive (RX) low-noise amplifiers (LNAs) in two different time slots.

18. The method of claim 17, further comprising coupling the first amplifier circuit via a first DPDT switch to the first bidirectional phase-shift circuit.

19. The method of claim 17, further comprising coupling the second amplifier circuit via a second DPDT switch to the second bidirectional phase-shift circuit.

20. The method of claim 17, further comprising coupling a first and a second splitter-combiner circuits to the first and the second bidirectional phase-shift circuits, respectively, and configuring the first splitter-combiner circuit to couple the transceiver circuit to a main active power combiner-divider circuit, wherein the main active power combiner-divider circuit is configured to couple a plurality of similar bidirectional time-division duplexing transceiver circuits to a mixer block.

* * * * *